(12) United States Patent
Kuzmenka

(10) Patent No.: US 6,953,893 B1
(45) Date of Patent: Oct. 11, 2005

(54) CIRCUIT BOARD FOR CONNECTING AN INTEGRATED CIRCUIT TO A SUPPORT AND IC BGA PACKAGE USING SAME

(75) Inventor: Maksim Kuzmenka, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/815,224

(22) Filed: Mar. 31, 2004

(51) Int. Cl.[7] .............................................. H01L 23/28
(52) U.S. Cl. ...................... 174/52.4; 257/690; 257/778
(58) Field of Search .............................. 174/52.1, 52.2, 174/52.3, 52.4; 257/666, 676, 692, 778, 784, 257/786, 690

(56) References Cited

U.S. PATENT DOCUMENTS

| | | | | |
|---|---|---|---|---|
| 5,677,566 A | * | 10/1997 | King et al. ................. | 257/666 |
| 6,084,300 A | * | 7/2000 | Oka ............................ | 257/730 |
| 6,246,117 B1 | * | 6/2001 | Ichinose ..................... | 257/738 |
| 6,252,298 B1 | * | 6/2001 | Lee et al. ................... | 257/668 |
| 6,469,393 B2 | * | 10/2002 | Oya ............................ | 257/779 |
| 6,552,427 B2 | * | 4/2003 | Moden ........................ | 257/692 |

* cited by examiner

Primary Examiner—Dean A. Reichard
Assistant Examiner—Carmelo Oliva
(74) Attorney, Agent, or Firm—Slater & Matsil, L.L.P.

(57) ABSTRACT

An apparatus for connecting an integrated circuit to a support has a circuit board having a first surface for attaching the integrated circuit and a second surface opposite to the first surface. Recesses are provided in the second surface for receiving at least portions of solder balls for electrically and mechanically connecting the circuit board to the support. Solder pads are formed within the recesses. An IC BGA package making use of such an integrated circuit can be implemented with a reduced height and improved electrical characteristics when compared to existing designs.

18 Claims, 2 Drawing Sheets

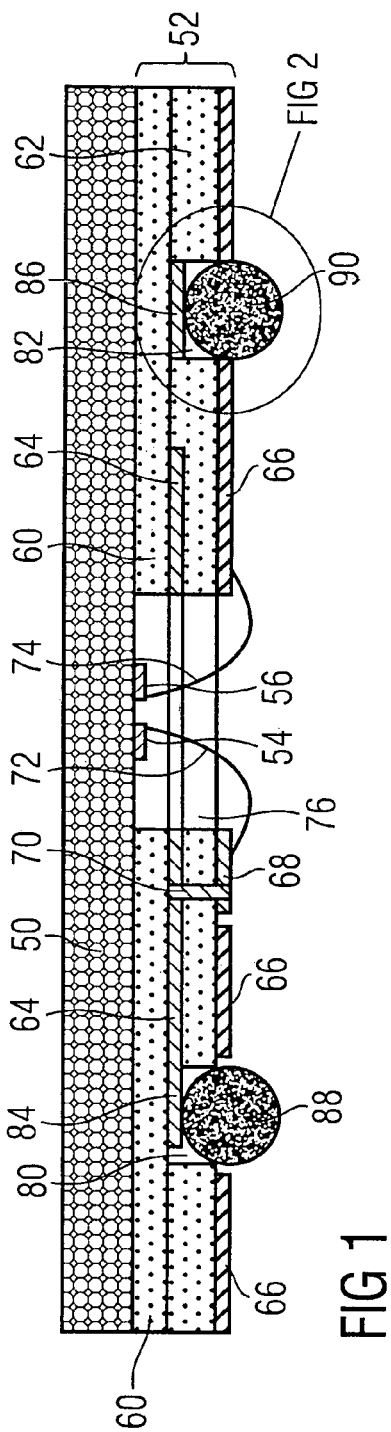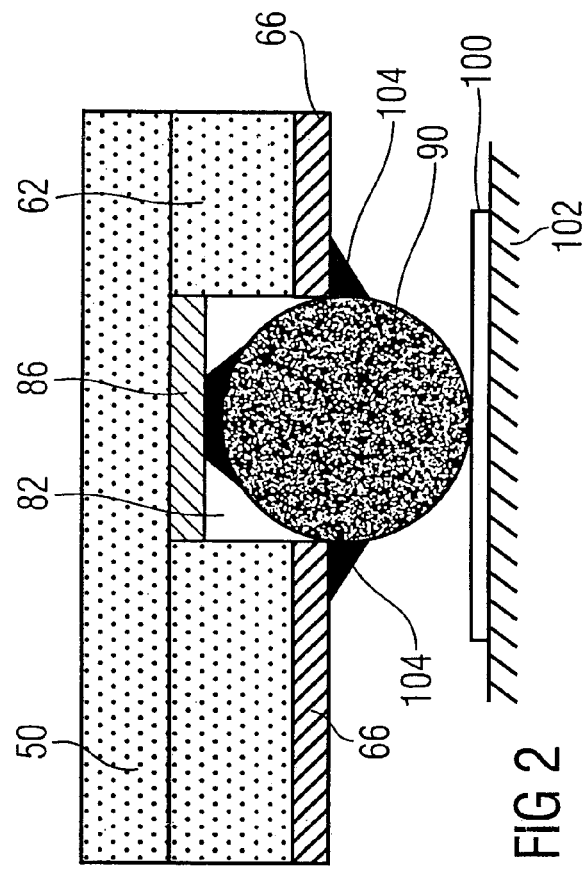

CIRCUIT BOARD FOR CONNECTING AN INTEGRATED CIRCUIT TO A SUPPORT AND IC BGA PACKAGE USING SAME

BACKGROUND OF THE INVENTION

1. Field of the Invention

The present invention relates to a circuit board, a method for producing a circuit board and, in particular, a circuit board for mechanically and electrically connecting an integrated circuit chip to a support structure, such as a motherboard or the like. Moreover, the present invention relates to an IC BGA (Integrated Circuit Ball Grid Array) package making use of such a circuit board.

2. Description of Prior Art

A schematic cross-sectional view of an existing design of an IC BGA package is shown in FIG. 3.

The IC BGA package comprises an IC chip 10 and a PCB (printed circuit board) 12 for mechanically and electrically connecting the IC chip 10 to an external support, a motherboard or a memory module for example.

The PCB 12 comprises a first dielectric layer 14 and a second dielectric layer 16. A GND/VDD conductive plane 18 is arranged between the first dielectric layer 14 and a second dielectric layer 16. The GND/VDD conductive plane 18 may be a GND conductive plane (GND=ground) or a VDD conductive plane (VDD=power supply potential). Conductive patterns 20 and 22 on the lower surface of the second dielectric layer 10 are electrically connected to the GND/VDD conductive plane 18 by vias 24 and 26. Moreover, the conductive pattern 20 is connected to a GND/VDD pad (not shown) on the IC chip 10 by a bond wire 28. The conductive pattern 22 is provided with a solder ball 30.

In addition, a conductive pattern 32 forming a signal trace is provided on the lower surface of the second dielectric layer 16. The signal trace 32 is connected to a signal pad (not shown) on the IC chip 10 by a bond wire 34. Moreover, the conductive pattern forming the signal trace 32 is provided with a solder ball 36.

The solder ball 30 is for connecting the IC BGA package to a GND/VDD plane on a support, while the solder ball 36 is for connecting to a signal plane on a support, e.g., for soldering a packaged IC to the mother board or a memory module PCB. It is to be noted that only two exemplary solder balls 30 and 36 are shown in the schematic cross-sectional view of FIG. 3 while IC BGA packages generally comprise a multitude of solder balls.

As it is shown in FIG. 3, a recess 38 is formed in the PCB 12 through which the bond wires 28 and 34 are connected to the respective pads on the IC chip 10. The recess is generally referred to as bond channel.

The total height of the existing design of the IC BGA package is large due to the size of the solder balls 30 and 36. In addition, the GND or VDD path from the bond wire 28 to the solder ball 30 includes a minimum of two vias 24, 26. Thus, the total power/ground inductance is increased due to the plurality of vias (24 and 26) in the current path.

Up to now, package height could be reduced only by reducing the number of package PCB layers and/or decreasing the dimension of the solder balls and the thickness of the chip itself. A smaller total power/ground inductance could be achieved by a larger number of solder balls for implementing supply connections.

It is the object of the present invention to provide an apparatus for connecting an integrated circuit to a support and an IC BGA package enabling an increased component density while maintaining good electrical properties.

According to a first aspect of the invention, this object is achieved by an apparatus for connecting an integrated circuit to a support, comprising:

a circuit board having a first surface for attaching the integrated circuit and a second surface opposite to the first surface;

recesses provided in the second surface for receiving at least portions of solder balls for electrically and mechanically connecting the circuit board to the support; and solder pads formed within the recesses.

According to a second aspect, the present invention provides an IC BGA package comprising:

an integrated circuit;

a circuit board having a first surface to which the integrated circuit is attached and a second surface opposite to the first surface;

recesses provided in the second surface for receiving at least portions of solder balls for electrically and mechanically connecting the circuit board to a support; and solder pads formed within the recesses.

In preferred embodiments of the present invention, the circuit board comprises a plurality of insulating layers and internal conductive patterns arranged between the insulating layers. The internal conductive pattern can also be referred to as internal conductive layers. The solder pads in some of the recesses may be portions of such internal conductive layers so that solder balls can be directly applied to the internal conductive layers of the circuit board via recesses in one or more of the insulating layers.

A conductive pattern can be formed on the second surface of the circuit board. In preferred embodiments of the invention, an external ground or VDD plane can be implemented by such a conductive pattern provided on the second surface of the circuit board. The recesses may extend through the conductive pattern on the second surface of the circuit board. Solder balls received in some of the recesses may have direct connection to the conductive pattern on the second surface of the circuit board.

The present invention provides for a circuit board and an IC BGA package having solder balls "drowned" into the recesses provided in the circuit board. Thus, the present invention provides a new design of an IC BGA package with reduced dimensions and improved electrical characteristics.

The conventional BGA package (FIG. 3) with a printed circuit board having two conductive layers has usually one layer substantially occupied by signal traces 32 and another layer (VDD or ground) which occupies a substantial array of the circuit board for a better (reduced) power connection inductance. The present invention enables an improved package having a changed order of layers with which the disadvantages caused by the existing design can be overcome. According to the invention, solder balls can be mounted on internal conductive layers through the recesses or voids in the circuit board. Thus, total package height can be reduced, for example by about half of the solder ball diameter depending on the depth of the recesses. In addition, the GND or VDD conductive plane can have direct connection with associated GND or VDD solder balls so that, for the power supply connection, vias are not required anymore. The inductance of the solder balls will be also reduced due to the smaller current path.

In a preferred embodiment of the present invention, an external conductive plane provided on the second surface of the circuit board is effective as an electromagnetic shield between package traces and the surrounding. Moreover, the whole package will have a better thermal connection to the support to which the chip is mounted making use of the circuit board. Such a support may be any printed circuit board, a mother-board or a memory module board, for example.

Other features and advantages of the present invention will become apparent from the following detailed description, taken in conjunction with the accompanying drawings, illustrating by way of example the principles of the invention.

BRIEF DESCRIPTION OF THE DRAWINGS

FIG. 1 shows a schematic cross-sectional view of an IC BGA package according to an embodiment of the invention.

FIG. 2 shows an enlarged schematic cross-sectional view of the portion of the IC BGA package indicated in FIG. 1.

DETAILED DESCRIPTION OF PREFERRED EMBODIMENTS

Figure 3:
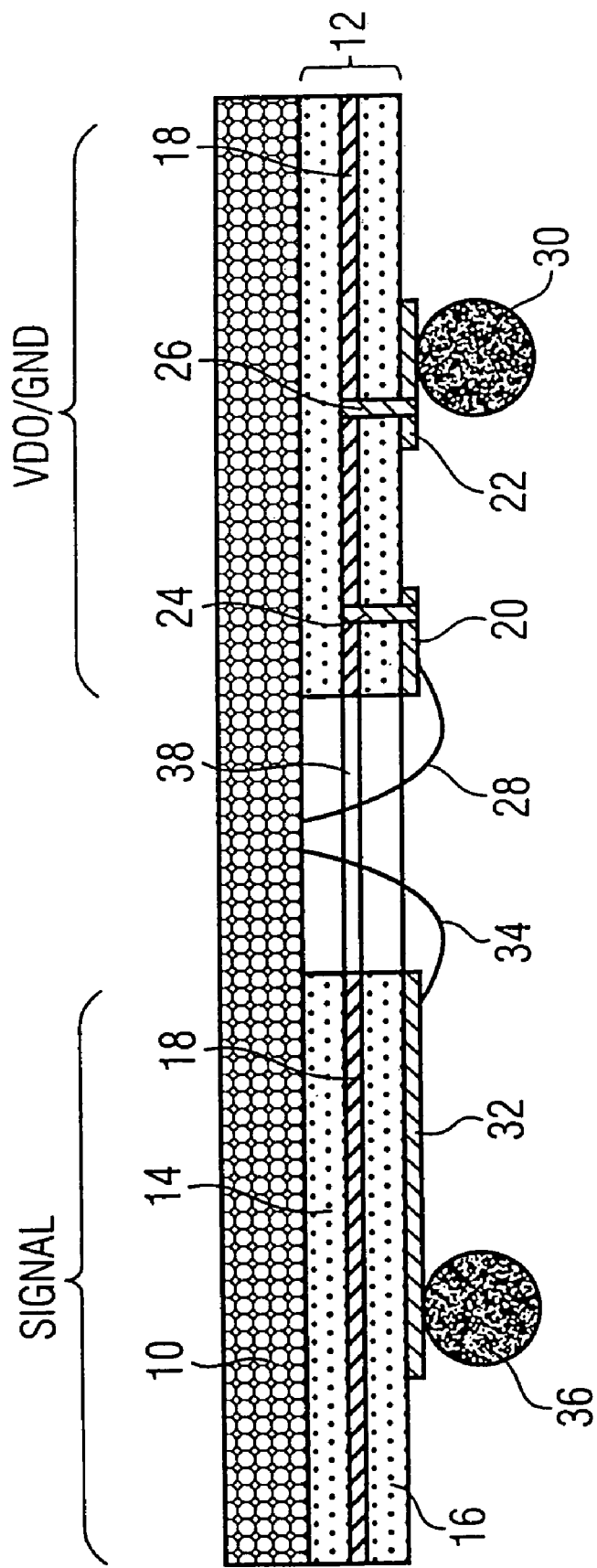
FIG. 3 shows a schematic cross-sectional view of an existing design of an IC BGA.

An embodiment of an inventive IC BGA package is shown in FIG. 1. The IC BGA package comprises an IC chip 50 and a circuit board 52 for mechanically and electrically connecting the IC chip 50 to a support. The IC chip 50 can be formed by a conventional semiconductor integrated circuit chip, a memory chip for example. The support (not shown in FIG. 1) can be formed by a circuit board to which the IC chip is to be mounted, a memory module board, for example.

Contact pads 54 and 56 are formed on the lower surface of the IC chip 50. Contact pad 54 represents a signal contact pad, while contact pad 56 represents a power supply contact pad. Only two contact pads e.g. signal and power are shown in the cross-sectional view of FIG. 1. It is, however, clear for a man of ordinary skill that the IC chip is provided with a plurality of contact pads, such as data signal pads, clock signal pads, control signal pads, ground pads and supply voltage pads.

The circuit board 52 comprises a first dielectric layer 60 and a second dielectric layer 62. The upper surface of the circuit board 52 is mounted to the IC chip 50 by mounting the upper surface of the first dielectric layer 60 to the lower surface of the IC chip 50. The upper surface of the second dielectric layer 62 is mounted to the lower surface of the first dielectric layer 60. A conductive pattern 64 representing signal traces is provided between the first dielectric layer 60 and the second dielectric layer 62.

A conductive pattern 66 forming a GND/VDD conductive plane (GND conductive pattern or VDD conductive pattern) is formed on the lower surface of the second dielectric layer 62. In addition, a bond pad 68 representing a signal bond pad is formed on the lower surface of the second dielectric layer 62. The signal bond pad 68 is connected to the signal traces 64 by a via 70. In addition, the bond pad 68 is connected to the contact pad 54 on the IC chip 50 by a bond wire 72. The GND/VDD conductive plane 66 is connected to the contact pad 56 on the IC chip 50 by a bond wire 74. A recess 76, generally referred to as a bond channel, is provided in the circuit board 52 for enabling the above connections making use of the bond wires 72 and 74. The bond channel 76 may be formed in a conventional manner.

As can be seen in FIG. 1, a first recess 80 and a second recess 82 are formed in the circuit board 52. To be more specific, the recesses 80 and 82 are formed to penetrate the second dielectric layer 66 and to extend to respective solder pads 84 and 86. Thus, the solder pads 84 and 86 are provided within the recesses 80 and 82, respectively. As can be seen in FIG. 1, the solder pad 84 is part of the conductive pattern 64 forming the signal traces. To this end, the conductive pattern 64 extends into the region where the recess 80 is formed. The solder pad 86 formed in the recess 82 is electrically insulated from the conductive pattern 64, but can be formed making use of the same process steps which are used for forming the conductive pattern 64.

As can be seen in FIG. 1, the conductive pattern forming the GND/VDD conductive plane 66 extends to be substantially flush with the edges of the second recess 82, while same does not extend to the edges of the first recess 80.

With the above design, the circuit board 52 enables connection, e.g. by soldering, of the IC chip 50 to a support making use of solder balls 88 and 90. As can be seen in FIG. 1, the solder balls 88 and 90 are inserted into the recesses 80 and 82 and attached to the solder pads 84 and 86. As can be seen in FIG. 1, in this embodiment about the half of the solder balls is arranged within the recesses. Thus, a substantial reduction of about half the height of the solder balls can be achieved, while the solder balls do still permit a secure mechanical and electrical connection to associated contact pads on a support.

The solder ball 88 is for electrically connecting the signal traces 64 to an associated signal pad on the support. Thus, the solder ball 88 is soldered to the solder pad 84 and insulated from the GND/VDD conductive plane 66. This insulation is achieved by providing a clearance between the edges of the GND/VDD conductive plane 66 and the edges of the recess 80.

The solder ball 90 is for providing an electrical connection between the GND/VDD conductive plane 66 and an associated contact pad 100 on a support 102 shown in FIG. 2. It can be seen in FIG. 2 that the solder ball 90 is soldered to the solder pad 86. Moreover, in the embodiment shown in FIG. 2, additional means are provided in order to achieve a secure electrical connection between the solder ball 90 and the GND/VDD conductive plane 66. To be more specific, the solder ball 90 is electrically connected to the GND/VDD conductive plane making use of solder 104. Alternatively, electrolytic plating could be used in order to ensure an electrical connection between the solder ball 90 and the GND/VDD conductive plane.

It is clear from the above description that the height of an IC BGA package can be reduced by providing the recesses 80 and 82 when compared to the height of a conventional IC BGA package as shown in FIG. 3, for example. Thus, the present invention provides for a compact arrangement. Moreover, the solder ball 90 is directly connected to the GND/VDD conductive plane without the use of vias as it was the case in the conventional IC BGA package. Thus, inductance of the GND/VDD connection can be reduced. Moreover, the changed order of the conductive planes (signal plane between the dielectric layers 60 and 62 and GND/VDD conductive plane on the lower surface of the second dielectric layer 62) makes it possible to use the GND/VDD conductive plane 66 as an electromagnetic shield between the package signal traces and the external word.

The inventive circuit board and the inventive IC BGA package can be formed of materials usually used in the field of printed circuit boards and IC BGA packages. Since such materials are known to a man of ordinary skill it is not necessary to indicate such materials in detail. Only two solder balls and associated recesses have been described in the above specification. However, it is clear for a man of ordinary skill that an IC BGA package reduced to practice may include a different number of solder balls as appropriate. Moreover, the circuit board may have a different number of dielectric layers, conductive planes and solder balls depending on the signals to be transmitted (such as power supply signals, data signals, clock signals, control signals and the like).

While this invention has been described in terms of preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What it is claimed is:

1. An apparatus for connecting an integrated circuit to a support, comprising:
   a circuit board having a first surface for attaching the integrated circuit and a second surface opposite to the first surface;
   recesses provided in the second surface for receiving at least portions of solder balls for electrically and mechanically connecting the circuit board to the support; and
   solder pads formed within the recesses,
   wherein a conductive pattern is formed on the second surface of the circuit board.

2. The apparatus of claim 1, wherein a bond pad is provided on the circuit board and wherein the circuit board comprises conductive structures connecting the bond pad to at least one of the solder pads.

3. The apparatus of claim 1, wherein the circuit board comprises a first insulating layer, a second insulating layer and a conductive pattern between the first and the second insulating layer.

4. The apparatus of claim 3, wherein the recesses extend through the second insulating layer and wherein a portion of the conductive pattern forms the solder pad of at least one of the recesses.

5. The apparatus of claim 1, wherein at least one of the recesses extend through the conductive pattern on the second surface of the integrated circuit.

6. The apparatus of claim 5, wherein at least two of the recesses extend through the conductive pattern on the second surface of the integrated circuit, wherein solder balls are received in the at least two of the recesses, one of the solder balls being electrically connected to the conductive pattern on the second surface of the integrated circuit and one of the solder balls being insulated therefrom.

7. The apparatus of claim 1, wherein the conductive pattern on the second surface of the circuit board is a ground pattern or a power supply pattern.

8. The apparatus of claim 1, wherein solder balls are received in the recesses, wherein the circuit board comprises conductive structures for connecting at least some of the solder balls to a signal contact pad on the integrated circuit and for connecting at least another of the solder balls to a ground or power supply contact pad on the integrated circuit.

9. An apparatus for connecting an integrated circuit to a support, comprising:
   a circuit board having a first surface for attaching the integrated circuit and a second surface opposite to the first surface;
   recesses provided in the second surface for receiving at least portions of solder balls electrically and mechanically connecting the circuit board to the support; and
   solder pads formed within the recess, wherein the circuit board comprises a plurality of insulating layers defining different levels of the circuit board and a plurality of conductive patterns arranged in the different levels, said circuit board further comprising a first recess and a second recess, wherein in a first conductive pattern arranged on a first level extends to the first recess and a second conductive pattern arranged on a second level extends to the second recess wherein a first solder ball which is at least partially received in the first recess is electrically connected to the first conductive pattern and a second solder ball which is at least partially received in the second recess is electrically connected to the second conductive pattern.

10. An IC BGA package comprising:
    an integrated circuit;
    a circuit board having a first surface to which the integrated circuit is attached and a second surface opposite to the first surface;
    recesses provided in the second surface for receiving at least portions of solder balls for electrically and mechanically connecting the circuit balls to a support;
    solder pads are formed within the recesses; and
    solder balls at least partially received in the recesses and applied to the solder pads, wherein a conductive pattern is formed on the second surface of the circuit board.

11. The IC BGA package of claim 10, wherein a bond pad is provided on the circuit board and wherein the circuit board comprises conductive structures connecting the bond pad to at least one of the solder pads.

12. The IC BGA package of claim 10, wherein the circuit board comprises a first insulating layer, a second insulating layer and a conductive pattern between the first and the second insulating layer.

13. The IC BGA package of claim 12, wherein the recesses extend through the second insulating layer and wherein a portion of the conductive pattern forms the solder pad of at least one of the recesses.

14. The IC BGA package of claim 10, wherein at least one of the recesses extend through the conductive pattern on the second surface of the integrated circuit.

15. The IC BGA package of claim 14, wherein at least two of the recesses extend through the conductive pattern on the second surface of the integrated circuit, wherein solder balls are received in the at least two of the recesses, one of the solder balls being electrically connected to the conductive pattern on the second surface of the integrated circuit and one of the solder balls being insulated therefrom.

16. The IC BGA package of claim 10, wherein the conductive pattern on the second surface of the circuit board is a ground pattern or a power supply pattern.

17. The IC BGA package of claim 10, wherein the circuit board comprises conductive structures for connecting at least one of the solder balls to a signal contact pad on the integrated circuit and for connecting at least another of the solder balls to a ground or power supply terminal on the integrated circuit.

18. An IC BGA package comprising:
    an integrated circuit;
    a circuit board having a first surface to which the integrated circuit is attached and a second surface opposite to the first surface;

recesses provided in the second surface for receiving at least portions of solder balls for electrically and mechanically connecting the circuit balls to a support;

solder pads are formed within the recesses; and solder balls at least partially received in the recesses and applied to the solder pads, wherein the circuit board comprises a plurality of insulating layers defining different levels of the circuit board and a plurality of conductive patterns arranged in the different levels, said circuit board further comprising a first recess and a second recess, wherein in a first conductive pattern arranged on a first level extends to the first recess and a second conductive pattern arranged on a second level extends to the second recess wherein a first solder ball which is at least partially received in the first recess is electrically connected to the first conductive pattern and a second solder ball which is at least partially received in the second recess is electrically connected to the second conductive pattern.

* * * * *